United States Patent [19]

Inoue et al.

[11] Patent Number: 6,012,193
[45] Date of Patent: Jan. 11, 2000

[54] APPARATUS FOR WASHING DISC-SHAPED WORKPIECES

[75] Inventors: Yusuke Inoue; Hiroshi Yashiki, both of Kanagawa, Japan

[73] Assignee: Speedfam Co., Ltd., Japan

[21] Appl. No.: 09/078,999

[22] Filed: May 14, 1998

[30] Foreign Application Priority Data

May 21, 1997 [JP] Japan ..................................... 9-147326

[51] Int. Cl.⁷ .............................. B08B 5/00; B08B 11/00
[52] U.S. Cl. .................................... 15/77; 15/88.3; 15/102
[58] Field of Search .............................. 15/77, 88.3, 97.1, 15/102

[56] References Cited

U.S. PATENT DOCUMENTS

| 1,817,332 | 8/1931 | Worrall | 15/77 |
|---|---|---|---|
| 2,313,606 | 3/1943 | Webb et al. | 15/77 |
| 3,213,472 | 10/1965 | Cocchiaraley et al. | 15/77 |
| 4,774,738 | 10/1988 | Lenhardt | 15/77 |
| 5,311,634 | 5/1994 | Andros | 15/97.1 |
| 5,351,360 | 10/1994 | Suzuki et al. | 15/77 |
| 5,675,856 | 10/1997 | Itzkowitz | 15/77 |
| 5,806,137 | 9/1998 | Ishi et al. | 15/77 |

FOREIGN PATENT DOCUMENTS

| 61-76515 | 5/1986 | Japan . |
|---|---|---|
| 62-291773 | 12/1987 | Japan . |
| 08017771 | 1/1996 | Japan . |
| 09299895 | 11/1997 | Japan . |

*Primary Examiner*—Mark Spisich
*Assistant Examiner*—Theresa T. Snider
*Attorney, Agent, or Firm*—Snell & Wilmer LLP

[57] ABSTRACT

Both the front and rear surfaces and side of a disc-shaped workpieces W transferred along a transfer path 2 are washed by forward-rotating rollers 15a that contact the workpieces while rotating in a forward direction and backward-rotating rollers 15b that contact the workpieces while rotating in a backward direction, the respective types of rollers being located on the respective sides of the transfer path.

15 Claims, 4 Drawing Sheets

APPARATUS FOR WASHING DISC-SHAPED WORKPIECES

FIELD OF THE INVENTION

The present invention relates to a method and apparatus for washing substantially disc-shaped workpieces such as magnetic or optical disc substrates, silicon wafers, or glass wafers.

PRIOR ART

A well-known washing apparatus of this type is described in Japanese Patent Application Laid Open No. 8-17771. This apparatus includes multiple brush washing means each consisting of a pair of vertically-opposed rotating brushes that carry out brush washing by transferring a wafer by means of the rotational force of the vertical rotating brushes and stopping or decelerating the wafer at an appropriate position using a stopper.

In this conventional washing apparatus, however, the rotating brushes also act as a transfer mechanism and all brushes contact one another while rotating in a direction that facilitates the movement of the wafer, that is, a forward direction. Thus, both surfaces of the wafer and the rear of the side of the wafer relative to the transfer direction can be washed, but most of the front of the side of the wafer cannot be washed.

DISCLOSURE OF THE INVENTION

It is a technical object of this invention to provide a washing means that has a high washing efficiency and is capable of reliably washing not only both the front and rear surfaces of a disc-shaped workpieces but also both the front and rear of the side of the workpieces.

It is another technical object of this invention to provide a washing means that can wash both the right and left sides of the disc-shaped workpieces.

To achieve these objects, this invention provides a washing method that uses multiple washing rollers located on both sides of a transfer path to rotate at a speed higher than the workpieces transfer speed in order to wash the disc-shaped workpieces transferred in one direction along the transfer path by rotating some of the washing rollers in a forward direction relative to the workpieces transfer direction while rotating other rollers in a backward direction.

This washing method can wash not only both the front and rear surfaces of the workpieces but also the front of the side of the workpieces relative to the transfer direction using the washing rollers rotating in the backward direction, while washing the rear of the side of the workpieces using the washing rollers rotating in the forward direction.

In this method, the washing rollers preferably oscillate back and forth in the direction orthogonal to the workpieces transfer direction, thereby enabling the right and left sides of the workpieces to be washed more reliably.

In addition, to implement this method, this invention provides a washing apparatus having a transfer mechanism for transferring the disc-shaped workpieces along the transfer path and a washing means for washing both surfaces of the workpieces. The washing means consists of multiple washing rollers disposed on both sides of the transfer path and divided into forward-rotating rollers that contact the moving workpieces while rotating in the forward direction and backward-rotating rollers that contact the workpieces while rotating in the opposite direction.

According to a specific embodiment of this invention, each of the washing rollers on the first side of the transfer path and each of the washing rollers on the second side are disposed at opposite positions so as to constitute a pair, and some of the multiple sets of washing rollers are forward-rotating rollers while the remaining sets of washing rollers are backward-rotating rollers.

The washing roller is configured by coating the surface of a metallic core with a flexible washing member consisting of synthetic resin foam. In this case, multiple protrusions are preferably formed on the surface of the flexible member.

Preferably, this invention includes an oscillating mechanism for moving the washing rollers back and forth in a direction substantially orthogonal to the workpieces transfer direction and also includes, on the workpieces supply side of the transfer path, a positioning means for displacing the supplied workpieces to the center of the transfer path.

According to another specific embodiment, the transfer mechanism is composed of multiple transfer rollers disposed along the transfer path at an interval smaller than the outer diameter of the workpieces, and a motor that drives the transfer rollers. At least near the washing rollers, the transfer rollers are disposed in such a way that each set of two transfer rollers are opposed via the transfer path so that they can transfer the workpieces while sandwiching it on both surfaces.

In the washing apparatus according to this invention, multiple nozzles are disposed along the transfer path to supply a washing liquid to the workpieces being transferred.

DETAILED DESCRIPTION

A preferred embodiment of this invention is described below in detail with reference to the drawings.

Figure 1:
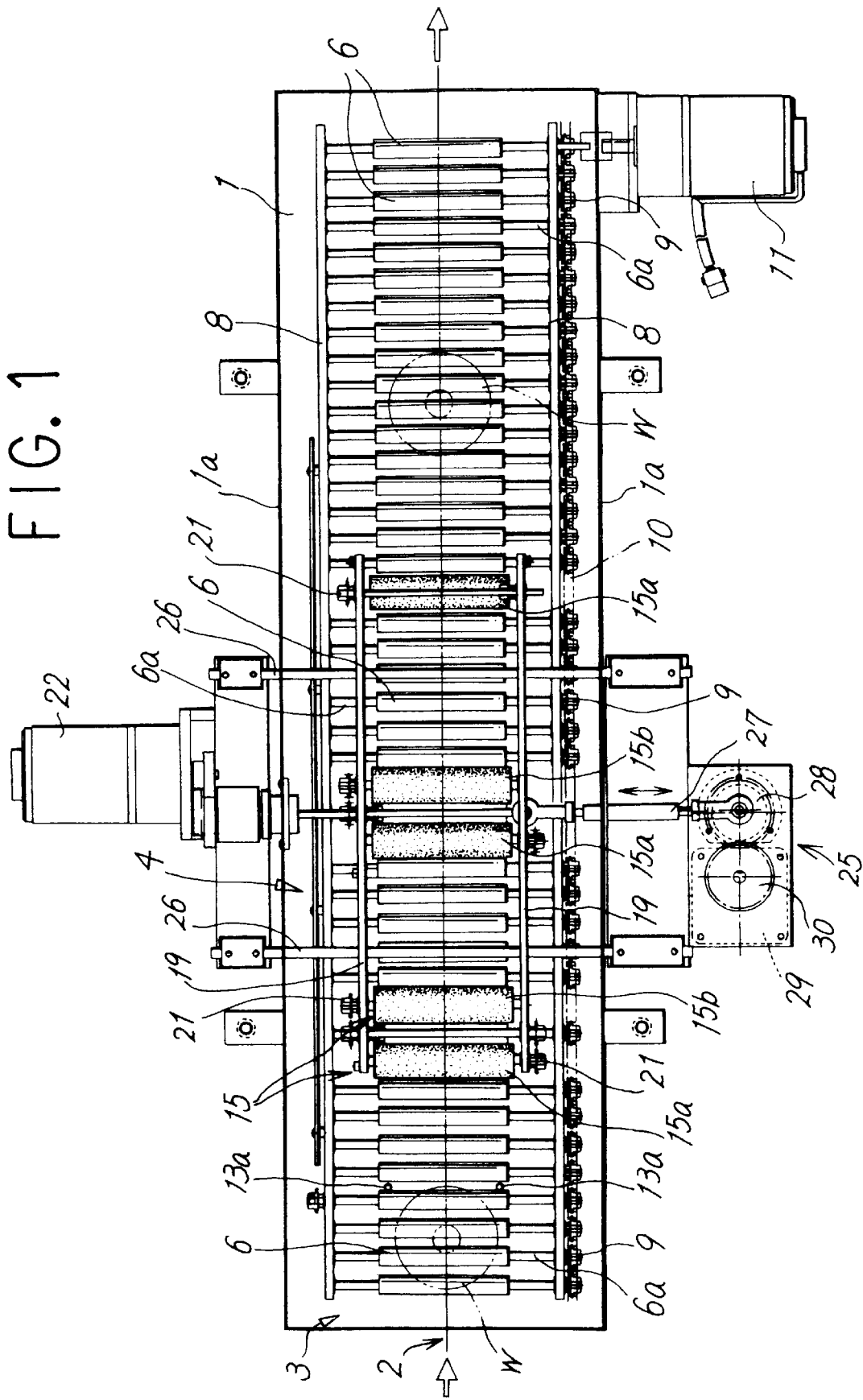
FIG. 1 is a top view showing one embodiment of a washing apparatus according to this invention.
Figure 2:
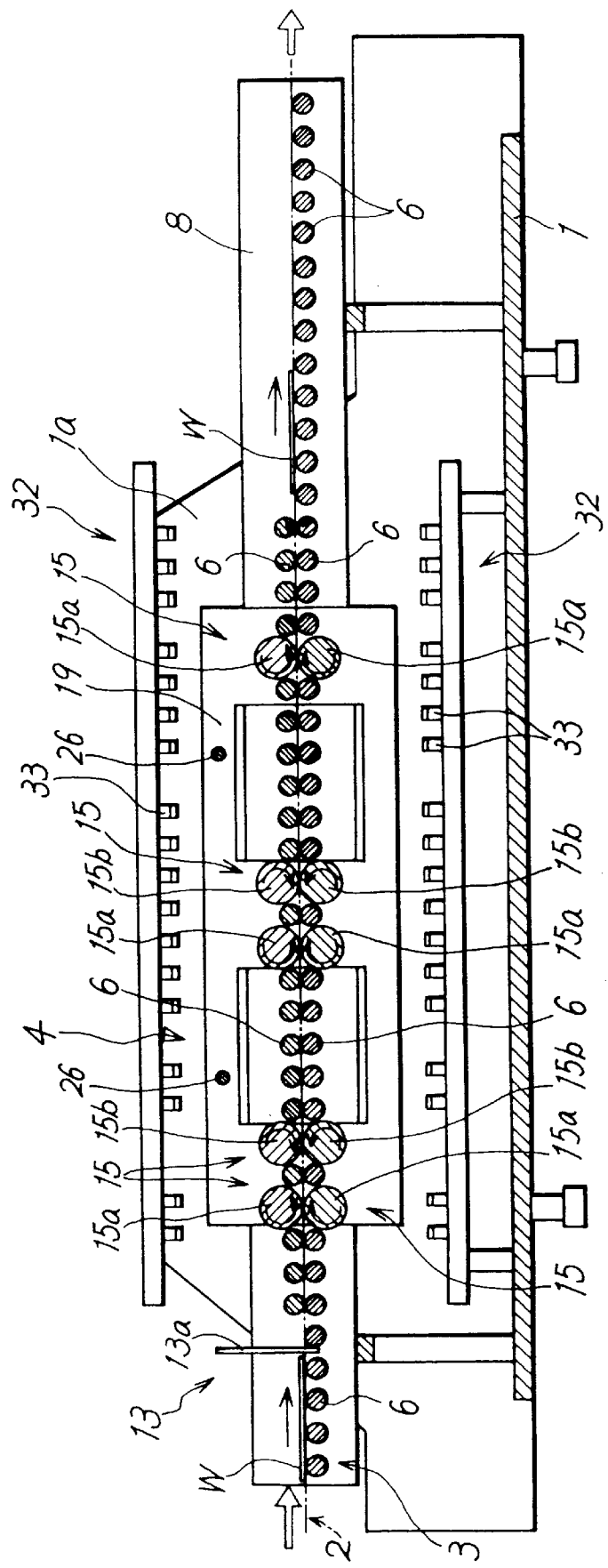
FIG. 2 is a sectional view of FIG. 1.

FIGS. 1 and 2 schematically show a preferred example of a washing apparatus according to this invention. Reference numeral 1 designates a body, 2 is a transfer path extending along the body in the horizontal direction, 3 is a transfer mechanism for transferring a disc-shaped workpieces W along the transfer path, and 4 is a washing means for washing both vertical surfaces of the workpieces transferred by the transfer mechanism 3.

The transfer mechanism 3 is composed of multiple rollers 6 disposed along the transfer path 2 at an interval smaller than the outer diameter of the workpieces W so that they can be rotationally driven. In the transfer roller 6, the respective ends of a roller shaft 6a are rotatably supported on lateral side frames 8, 8 extending horizontally from the body 1, a sprocket 9 is fixed to one end of each roller shaft 6a, and an endless chain 10 is passed around all the sprockets 9. The endless chain 10 is driven by a motor 11 to rotationally drive the transfer rollers 6 in the direction in which the workpieces W is transferred.

Those of the transfer rollers 6 which are located near a region in which the workpieces W is washed by the washing means 4 are opposed in the vertical direction so that the workpieces W being washed can be transferred stably while being sandwiched on both vertical surfaces. The remaining rollers are disposed below the transfer path before and after the washing region. Sets of two vertically opposed rollers may be provided all along the transfer path.

Each transfer roller 6 is preferably formed of a material that enables the workpieces W to be transferred safely and reliably without contaminating or damaging it; for example, synthetic resin or rubber that has appropriate flexibility and rigidity as well as a sufficient frictional force to enable the workpieces to be transferred against the acting force of the washing roller 15.

Figure 3:
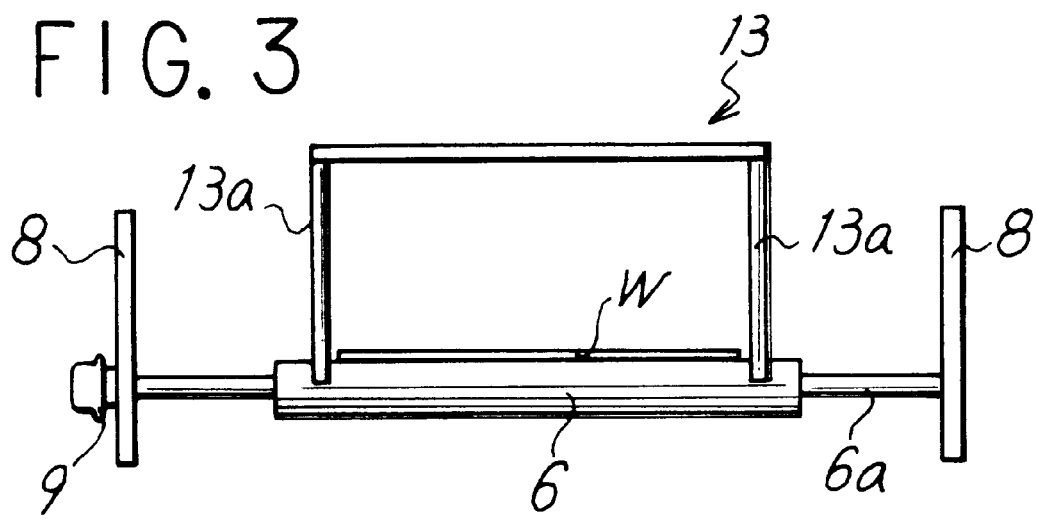
FIG. 3 is a front view of an integral part of FIG. 1.

A positioning means 13 for displacing the workpieces W to the center of the transfer path 2 so that the workpieces W, which is supplied by a loading means (not shown), is transferred correctly at the center is provided on the workpieces supply side of the transfer path 2. As shown in FIG. 3, the positioning means 13 is composed of two bar-like members 13a, 13a disposed at laterally symmetrical positions with respect to the center of the transfer path 2 at an interval slightly larger than the outer diameter of the workpieces W. Even if the workpieces W is supplied in such a way as to be biased to the right or left on the transfer path 2, it collides against either bar-like member 13a to change its direction and then passes between both bar-like members 13a, 13a to move to the correct position at the center of the transfer path 2.

The washing means 4 has multiple washing rollers 15 disposed above and below the transfer path 2 (first and second sides, respectively) so that they can be rotationally driven. The upper and lower washing rollers 15, are disposed at opposite positions in the vertical direction to wash the workpieces W passing between them, and multiple sets of two vertical rollers (five sets in the figure) are disposed along the transfer path 2 at a specified interval. The number of sets of installed washing rollers is not particularly limited, but multiple sets are preferably provided and the disposition interval can be set arbitrarily.

Figure 4:
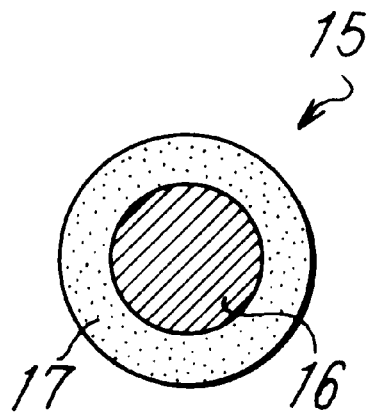
FIG. 4 is a sectional view showing an example of a washing roller.

Each washing roller 15 has a larger diameter than the transfer roller 6, and is formed by covering the surface of a metallic core 16 with a flexible member 17 made of, for example, synthetic resin foam, as shown in FIG. 4. The workpieces W is washed while slowly passing between the upper and lower washing rollers 15, 15 with the flexible member 17 slightly compressed.

Figure 5:
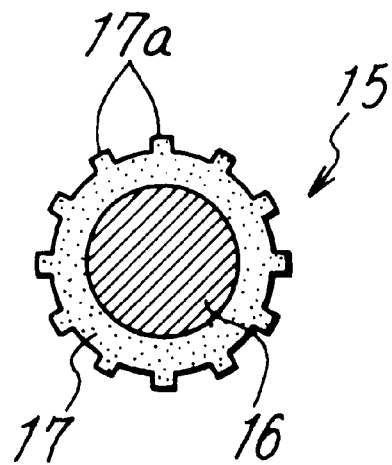
FIG. 5 is a sectional view showing another example of a washing roller.

Preferably, however, a large number of short cylindrical or similar-shaped washing protrusions 17a integrated with the flexible member 17 are provided on the surface covered with the flexible member 17, as in the washing roller 15 shown in FIG. 5.

Some of the multiple sets of the washing rollers 15 are forward-rotating rollers 15a that contact both surfaces of the moving workpieces W while rotating in a forward direction, while the remaining sets are backward-rotating rollers 15b that contact both surfaces of the workpieces W while rotating in a backward direction. In this case, the number and positions of the forward- and backward-rotating rollers 15a and 15b are not particularly limited, but of the five sets of washing rollers, the first, third, and fifth sets in the workpieces W transfer direction are forward-rotating rollers 15a, whereas the second and fourth sets are backward-rotating rollers 15b.

The rotating speeds of all washing rollers 15 are equal regardless of the rotating direction and the peripheral speed of the forward-rotating roller 15a is preferably set higher than the transfer speed of the workpieces W.

All transfer rollers 6 in the transfer mechanism 3 are rotationally driven in the forward direction relative to the workpieces W transfer direction.

Each washing roller 15 is rotatably supported by lateral supporting frames 19, 19 disposed so as not to obstruct the transfer rollers 6, and is rotationally driven by a motor 22 in a predetermined direction via a sprocket 21 fixed to the end of the roller shaft of each washing roller 15 and an endless chain (not shown) wound around the sprockets or a transmission mechanism consisting of gears. In this case, if the washing rollers 15, which rotate in different directions, are driven by a common motor 22, they are of course driven via a gear mechanism or similar (not shown) that changes the rotating direction.

Figure 6:
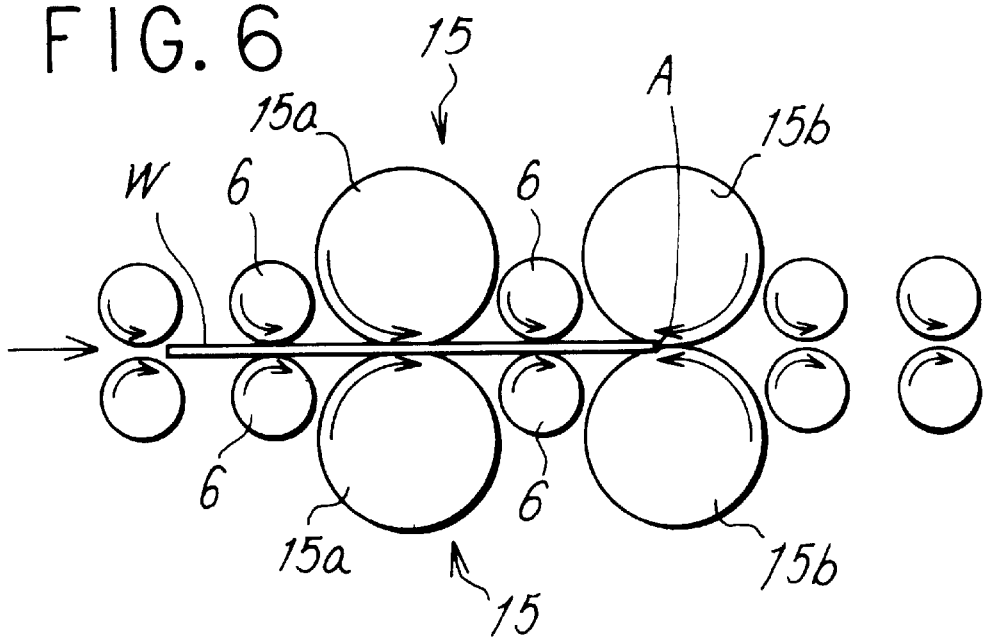
FIG. 6 is a schematic enlarged view of FIG. 2 illustrating a process for washing the side of a workpieces using backward-rotating rollers.
Figure 7:
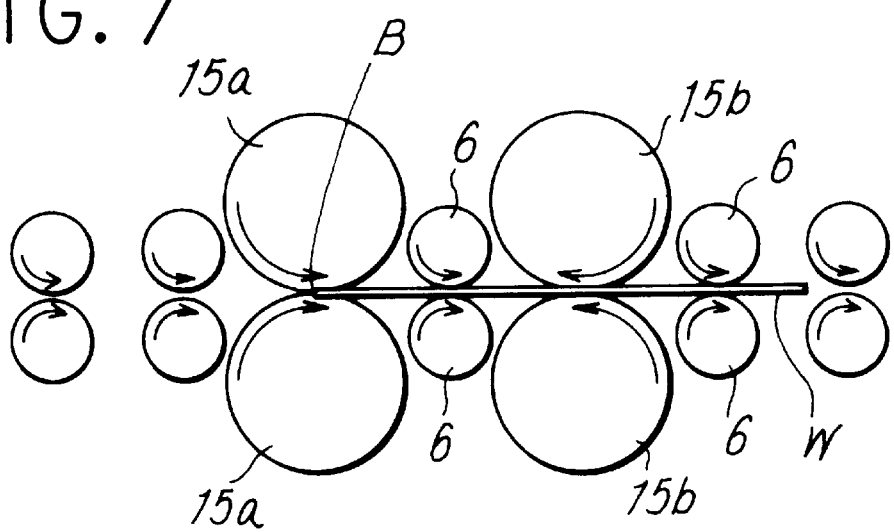
FIG. 7 is a schematic enlarged view of FIG. 2 illustrating a process for washing the side of a workpieces using forward-rotating rollers.
Figure 8:
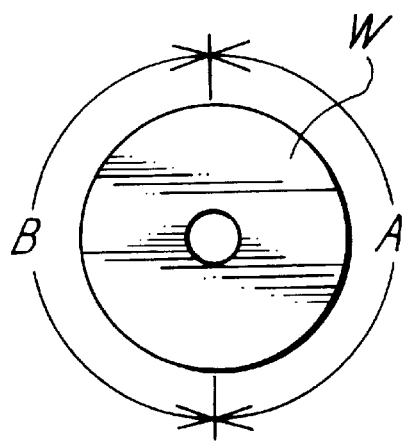
FIG. 8 is a schematic side view of another example of an arrangement of washing rollers.

Thus, the washing rollers 15 are divided into the forward- and backward-rotating rollers 15a and 15b. Consequently, after the workpieces W has contacted the backward-rotating rollers 15b and before it passes them as shown in FIG. 6, the backward-rotating rollers 15b wash the front of the side of the workpieces W, that is, a portion A of the workpieces W extending from the front end surface to the front of the lateral sides, as shown in FIG. 8. Then, when the workpieces W passes the forward-rotating rollers 15a, as shown in FIG. 7, the rollers 15a wash the rear of the side of the workpieces W, that is, a portion B extending from the rear of the right and left sides to the rear end surface. Of course, the vertical surfaces of the workpieces are also washed.

The supporting frames 19, 19 for the washing means 4 are connected to an oscillating mechanism 25 so as to oscillate back and forth in a direction orthogonal to the transfer path. The supporting frames 19, 19 are oscillatorily supported by multiple guide rods 26 attached to lateral side walls 1a, 1a of the body 1 in such a way as to cross the transfer path 2, the tip of an oscillating arm 27 is connected to one of the supporting frames 19, and the proximal end of the oscillating arm 27 is attached to an eccentric position of a drive gear 28, which meshes with a drive gear 30 of an oscillating motor 29. Thus, when the oscillating gear 28 is rotated by the oscillating motor 29, the oscillating arm 27 cause the supporting frames 19, 19 to oscillate along the guide rod 16 to move the washing rollers 15 back and forth in the direction orthogonal to the transfer path 2. This operation enables the lateral sides of the workpieces W to be washed reliably.

Reference numeral 32 in FIG. 2 designates a water supply mechanism provided along the transfer path 2 and having multiple nozzles 33 that inject a washing liquid such as water or a detergent against the vertical surfaces of the workpieces W being transferred.

In the washing apparatus with this configuration, when passing between the two bar-like members 13a, 13a of the positioning means 13, the workpieces W, which has been supplied at the starting end of the transfer path 2 by a loading means (not shown), is displaced to the center of the transfer path 2 and is fed to the washing means 4. The workpieces W is washed while sequentially passing through the multiple sets of vertical washing rollers 15, 15, and is then picked up at the terminal of the transfer path 2 by an unloading means (not shown).

Of the five sets of washing rollers 15 of the washing means 4, the first, third, and fifth sets are the forward-rotating rollers 15a that contact the workpieces W while rotating in the forward direction while the second and fourth sets are the backward-rotating rollers 15b that contact the workpieces W while rotating in the backward direction, so the washing rollers 15a and 15b wash the vertical surfaces of the workpieces W, as shown in FIG. 2. In addition, the backward-rotating roller 15b washes the front A of the side of the workpieces W, as shown in FIG. 6, while the forward-rotating roller 15a washes the rear B of the side of the workpieces W. Furthermore, since each set of the washing rollers 15a and 15b oscillate back and forth in the direction orthogonal to the transfer path 2, the lateral surfaces of the workpieces W are washed reliably. As a result, the washing rollers 15a and 15b reliably wash all the vertical and lateral surfaces of the workpieces W without leaving unwashed parts.

In the above embodiment, if the backward-rotating rollers 15b are used, several sets of the vertically-opposed washing rollers operate as the backward-rotating rollers. However, only the upper or lower washing roller of each set may be the backward-rotating roller. Moreover, if all upper washing rollers may be the forward-rotating rollers 15a, all lower washing rollers may be the forward-rotating rollers 15b, or vice versa.

In addition, the vertical washing rollers need not necessarily be opposed vertically, so the numbers of upper and lower washing rollers need not necessarily be the same. In addition, some of either the upper or lower washing rollers or both may be the backward-rotating rollers.

Furthermore, although the above embodiment shows a disc-shaped workpieces, rectangular workpieces can be similarly washed.

In addition, the present technical concept is not limited to an apparatus handling the workpieces in the horizontal direction as shown in the embodiment but can also be applied to an apparatus handling the workpieces in the vertical direction.

Thus, this invention divides the washing rollers into the forward-rotating rollers that rotate in the forward direction relative to the workpieces transfer direction and the backward-rotating rollers that rotate in the backward direction in order to enable the reliable washing of not only both the front and rear surfaces of the disc-shaped workpieces but also the front and rear of the side relative to the transfer direction.

Moreover, by oscillating the washing rollers in the direction orthogonal to the workpieces transfer direction, the lateral sides of the workpieces can be washed reliably without leaving unwashed parts.

What is claimed is:

1. A disc-shaped-workpiece washing apparatus including a transfer mechanism for transferring disc-shaped workpieces along a transfer path; a washing means for washing both surfaces of the transferred workpieces and the side thereof; an oscillating mechanism for oscillating the washing means back and forth in a direction substantially orthogonal to the transfer path; and a liquid supply mechanism for supplying a washing liquid to said workpieces, wherein:

said washing means comprises multiple washing rollers rotatably disposed on both sides of the transfer path and driven by a motor, and the washing rollers are divided into forward-rotating rollers that contact the workpieces transferred on the transfer path while rotating in the forward direction relative to the transfer direction and backward-rotating rollers that contact the workpieces while rotating in the backward direction; and wherein:

said transfer mechanism comprises multiple transfer rollers disposed along the transfer path at an interval smaller than the outer diameter of the workpieces and a motor that drives the transfer rollers, and wherein at least near said washing rollers, said transfer rollers are disposed in such a way that each said pair of two transfer rollers are opposed via the transfer path so that they can transfer the workpieces being washed by sandwiching the workpieces on both surfaces; and wherein said oscillating mechanism includes an oscillating arm connected to one of a pair of supporting frames which supports said multiple washing rollers; an oscillating gear means for oscillating the oscillating arm back and forth; and a motor that oscillates the oscillating gear means.

2. A washing apparatus according to claim 1 wherein each of the washing rollers on a first side of the transfer path and each of the washing rollers on a second side of the transfer path are disposed at opposite positions so as to constitute pairs of said washing rollers and wherein some of the pairs of washing rollers are forward-rotating, rollers while the remaining said pairs are backward-rotating rollers.

3. A washing apparatus according to claim 1 or 2 wherein said washing rollers, comprise a metallic core whose surface is coated with a flexible washing member made of synthetic resin foam.

4. A washing apparatus according to claim 3 wherein said washing roller, have multiple protrusions from the surface of said flexible washing member.

5. A washing apparatus according to claim 1 or 2 including a positioning means for displacing supplied workpieces to the center of the transfer path.

6. A washing apparatus according to claim 5 wherein said positioning means comprises two bar-like members disposed at symmetrical positions relative to the center of the transfer path in such a way as to maintain between them a gap slightly larger than the outer diameter of the workpieces.

7. A washing apparatus according to claim 1 or 2 wherein said liquid supply mechanism comprises multiple nozzles disposed along the transfer path.

8. A disc-shaped-workpiece washing apparatus comprising:

a transfer mechanism for transporting disc-shaped workpieces along a transfer path;

washing means for washing both surfaces and the side of each of the workpieces transported alone said transfer path, wherein said washing means includes:

a plurality of washing rollers, driven by a motor, and rotatably disposed on both sides of the transfer path, wherein said washing rollers include forward-rotating rollers that contact the workpieces while rotating in the workpiece transfer direction, and backward-rotating rollers that contact the workpieces while rotating oppositely to the workpiece transfer direction; and an oscillating mechanism for oscillating said washing rollers back and forth in a direction substantially orthogonal to said transfer path, wherein said oscillating mechanism includes:

an oscillating arm connected to one of a pair of supporting frames which supports said plurality of washing rollers;

oscillating gear means for oscillating, the oscillating arm back and forth; and a motor for oscillating the oscillating gear means.

9. A washing apparatus according to claim 8 wherein each of the washing rollers on a first side of the transfer path and each of the washing rollers on a second side of the transfer path are disposed at opposite positions relative to the transfer path so as to constitute pairs of washing rollers and wherein some of the pairs are forward-rotating rollers while the remaining said pairs are backward-rotating rollers.

10. A washing apparatus according to claim 8 or 9 wherein said washing rollers, comprise a metallic core whose surface is coated with a flexible washing member made of synthetic resin foam.

11. A washing apparatus according to claim 10 wherein said washing rollers have multiple protrusions from the surface of said flexible washing member.

12. A washing apparatus according to claim 8 or 9 including a positioning means for displacing supplied workpieces to the center of the transfer path.

13. A washing apparatus according to claim 12 wherein said positioning means includes two bar-like members disposed at symmetrical positions relative to the center of the transfer path in such a way as to maintain between them a gap slightly larger than the outer diameter of the workpieces.

14. A washing apparatus according to claim 8 or 9 wherein said transfer mechanism comprises multiple transfer rollers disposed along the transfer path at an interval smaller than the outer diameter of the workpieces and a motor that drives the transfer rollers, and wherein said transfer rollers are disposed in such a way that each said pair of two transfer rollers are opposed via the transfer path so that they can transfer the workpieces being, washed by sandwiching the workpieces on both surfaces.

15. A washing apparatus according to claim 8 or 9 wherein multiple nozzles are disposed along said transfer path to supply a washing liquid to the workpieces being transferred.

\* \* \* \* \*